(12) United States Patent
Lin et al.

(10) Patent No.: US 11,774,836 B2
(45) Date of Patent: Oct. 3, 2023

(54) ILLUMINATION SYSTEM AND PROJECTION DEVICE

(71) Applicant: Coretronic Corporation, Hsin-Chu (TW)

(72) Inventors: Shi-Wen Lin, Hsin-Chu (TW); Tsung-Ching Lin, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 17/748,036

(22) Filed: May 19, 2022

(65) Prior Publication Data

US 2022/0373873 A1 Nov. 24, 2022

(30) Foreign Application Priority Data

May 21, 2021 (CN) .......................... 202121095664.2

(51) Int. Cl.
| | | |
|---|---|---|
| *G03B 21/16* | (2006.01) | |
| *H05K 7/20* | (2006.01) | |
| *G02B 27/28* | (2006.01) | |

(52) U.S. Cl.
CPC ........... *G03B 21/16* (2013.01); *G02B 27/283* (2013.01); *H05K 7/2039* (2013.01)

(58) Field of Classification Search
CPC ..... G03B 21/16; G02B 27/283; H05K 7/2039

USPC .......................................................... 353/52
See application file for complete search history.

(56) References Cited

U.S. PATENT DOCUMENTS

| | | | |
|---|---|---|---|
| 2003/0067586 A1* | 4/2003 | Chigira | ................ H04N 9/3117 348/E9.027 |
| 2016/0309125 A1* | 10/2016 | Hou | ...................... H04N 9/3197 |
| 2018/0239225 A1* | 8/2018 | Zhong | ................ G02B 26/0833 |

FOREIGN PATENT DOCUMENTS

| | | |
|---|---|---|
| TW | 200732697 | 9/2007 |
| TW | M574575 | 2/2019 |

* cited by examiner

*Primary Examiner* — Jerry L Brooks
(74) *Attorney, Agent, or Firm* — JCIPRNET

(57) ABSTRACT

An illumination system, including a housing, a first light source, a second light source, a polarization beam splitting element, and a heat dissipation module, is provided. The first light source and the second light source are disposed in the housing and are respectively configured to provide a first beam to the polarization beam splitting element along a first optical axis and a second beam to the polarization beam splitting element along a second optical axis. A portion of an inner surface of the housing has a light absorption region. The light absorption region is configured to absorb the first beam that is not reflected by the polarization beam splitting element and the second beam that does not penetrate the polarization beam splitting element, so as to convert them into heat. The heat generated by the light absorption region is dissipated by the heat dissipation module.

20 Claims, 6 Drawing Sheets

ILLUMINATION SYSTEM AND PROJECTION DEVICE

CROSS-REFERENCE TO RELATED APPLICATION

This application claims the priority benefit of China application serial no. 202121095664.2, filed on May 21, 2021. The entirety of the above-mentioned patent application is hereby incorporated by reference herein and made a part of this specification.

BACKGROUND

Technical Field

This disclosure relates to an optical system and a display device, and in particular to an illumination system and a projection device.

Description of Related Art

In the conventional technology, when there are multiple laser array light sources in a laser projection system, the light has to be combined through an optical architecture having stripe mirrors. However, under the condition that the laser array package structure and volume remain unchanged, in order to increase the total output wattage, more laser light sources have to be implanted in the same space. At this time, the distance between the laser light sources is reduced. When the distance is less than a certain range, the optical structure may no longer be used to combine the light. Instead, a polarization phenomenon of the semiconductor laser light source itself is used to combine the light through a polarization beam splitting element (PBS), which main function is to allow p-polarized waves (or s-polarized waves) to penetrate while reflecting s-polarized waves (or p-polarized waves). However, the transmittance or reflectivity of the current polarized spectroscopic lens has not reached 100%.

The information disclosed in this background section is only for enhancement of understanding of the background of the described technology and therefore it may contain information that does not form the prior art that is already known to a person of ordinary skill in the art. Furthermore, the information disclosed in this section does not mean that one or more problems to be resolved by one or more embodiments of the disclosure were acknowledged by a person of ordinary skill in the art.

SUMMARY

This disclosure provides an illumination system and a projection device, which may lower an internal temperature of the illumination system and prolong a service life of other internal elements.

Other objectives and advantages of the disclosure may be further understood from the technical features disclosed in the disclosure.

The disclosure provides an illumination system, including a housing, a first light source, a second light source, a polarization beam splitting element, and a heat dissipation module. The first light source and the second light source are disposed in the housing. The first light source is configured to provide a first beam to the polarization beam splitting element along a first optical axis, and the second light source is configured to provide a second beam to the polarization beam splitting element along a second optical axis. The polarization beam splitting element is configured to reflect a portion of the first beam and allows a portion of the second beam to penetrate. A portion of an inner surface of the housing has a light absorption region. The light absorption region is located on the first optical axis, and the polarization beam splitting element is located between the first light source and the light absorption region. The light absorption region is configured to absorb the first beam that is not reflected by the polarization beam splitting element and the second beam that does not penetrate the polarization beam splitting element, so as to transform them into heat. The heat dissipation module is disposed on an outer surface of the housing to correspond to a position of the light absorption region. The heat generated by the light absorption region is dissipated by the heat dissipation module.

The disclosure also provides a projection device, including an illumination system, at least one light valve, and a projection lens. The illumination system provides an illumination beam. The illumination system includes a housing, a first light source, a second light source, a polarization beam splitting element, and a heat dissipation module. The first light source and the second light source are disposed in the housing. The first light source is configured to provide a first beam to the polarization beam splitting element along a first optical axis, and the second light source is configured to provide a second beam to the polarization beam splitting element along a second optical axis. The polarization beam splitting element is configured to reflect a portion of the first beam and allow a portion of the second beam to penetrate. A portion of an inner surface of the housing has a light absorption region. The light absorption region is located on the first optical axis, and the polarization beam splitting element is located between the first light source and the light absorption region. The light absorption region is configured to absorb the first beam that is not reflected by the polarization beam splitting element and the second beam that does not penetrate the polarization beam splitting element, so as to transform them into heat. The heat dissipation module is disposed on an outer surface of the housing to correspond to a position of the light absorption region. The heat generated by the light absorption region is dissipated by the heat dissipation module. The at least one light valve is disposed on a transmission path of the illumination beam and is configured to convert/adjust the illumination beam into an image beam. The projection lens is disposed on a transmission path of the image beam and is configured to project the image beam out of the projection device.

Based on the above, the embodiments of the disclosure have at least one of the following advantages. In the illumination system and the projection device of the disclosure, the illumination system includes the housing, the first light source, the polarization beam splitting element, and the heat dissipation module. The first light source provides the first beam to the polarization beam splitting element along the first optical axis, and the polarization beam splitting element reflects a portion of the first beam. A portion of the inner surface of the housing has the light absorption region, and the light absorption region is located on the first optical axis. Therefore, the first beam that is transmitted to the housing without being reflected by the polarization beam splitting element may be absorbed by the light absorption region on the housing and transformed into heat, and then dissipated by the heat dissipation module that is disposed at the housing and corresponding to the light absorption region. In this way, the internal temperature of the illumination system may be lowered and the service life of other internal elements may be prolonged.

Other objectives, features and advantages of the disclosure can be further understood from the further technological features disclosed by the embodiments of the disclosure wherein there are shown and described preferred embodiments of the disclosure, simply by way of illustration of modes best suited to carry out the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the descriptions, serve to explain the principles of the disclosure.

DESCRIPTION OF THE EMBODIMENTS

In the following detailed description of the preferred embodiments, reference is made to the accompanying drawings which form a part hereof, and in which are shown by way of illustration specific embodiments in which the disclosure may be practiced. In this regard, directional terminology, such as "top", "bottom", "front", "back" etc., is used with reference to the orientation of the figure(s) being described. The components of the disclosure can be positioned in a number of different orientations. As such, the directional terminology is used for purposes of illustration and is in no way limiting. On the other hand, the drawings are only schematic and the size of the components may be exaggerated for clarity. It is to be understood that other embodiments may be utilized and structural changes may be made without departing from the scope of the disclosure. Also, it is to be understood that the phraseology and terminology used herein are for the purpose of description and should not be regarded as limiting. The usage of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
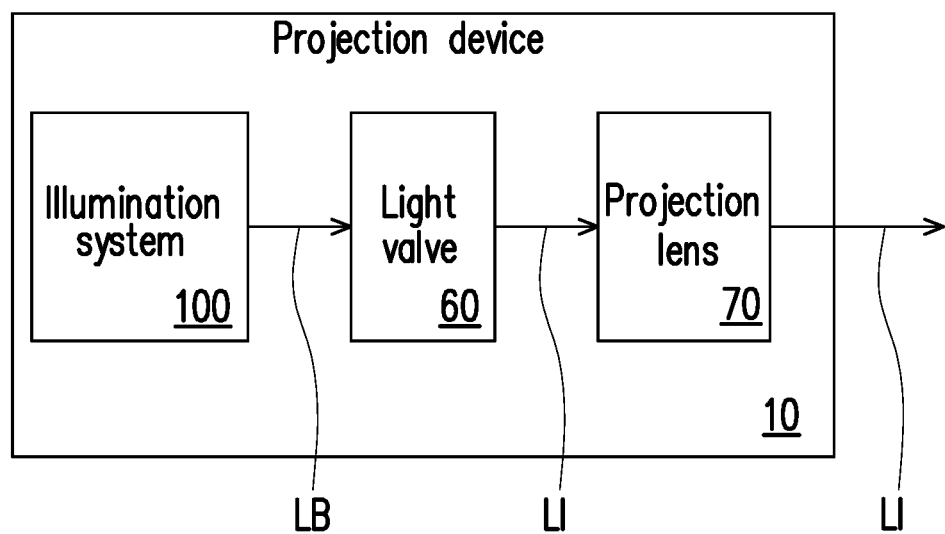
FIG. 1 is a schematic diagram of a projection device according to an embodiment of the disclosure.

FIG. 1 is a schematic diagram of a projection device according to an embodiment of the disclosure. With reference to FIG. 1, the embodiment provides a projection device 10, which includes an illumination system 100, at least one light valve 60, and a projection lens 70. The illumination system 100 is configured to provide an illumination beam LB. The at least one light valve 60 is disposed on a transmission path of the illumination beam LB and is configured to convert the illumination beam LB into an image beam LI. The projection lens 70 is disposed on a transmission path of the image beam LI and is configured to project the image beam LI out of the projection device 10 to a projection target (not shown), for example, a screen or a wall.

The light valve 60 is, for example, a reflective light modulator such as a liquid crystal on silicon panel (LCoS panel) and a digital micro-mirror device (DMD). In some embodiments, the light valve 60 may also be a transmissive optical modulator such as a transparent liquid crystal panel, an electro-optic modulator (EOM), a magneto-optic modulator, or an acousto-optic modulator (AOM). The disclosure does not limit the form and type of the light valve 60. Sufficient teachings, recommendations, and implementation instructions of detailed steps and implementation manners of a method of converting the illumination beam LB into the image beam LI by the light valve 60 may be obtained from general knowledge in the technical field, and therefore is not repeated. In the embodiment, the number of the light valve 60 is one, for example, the projection device 10 uses a single digital micro-mirror device, but in other embodiments, there may be more than one light valve 60, and the disclosure is not limited thereto.

The projection lens 70 includes, for example, a combination of one or more optical lenses with diopter. For example, various combinations of non-planar lenses such as a biconcave lens, a biconvex lens, a meniscus lens, a convex-concave lens, a plano-convex lens, and a plano-concave lens. In an embodiment, the projection lens 70 may further include a flat optical lens to project the image beam LI from the light valve 60 to the projection target in a reflective manner. The disclosure does not limit the form and type of the projection lens 70.

Figure 2:
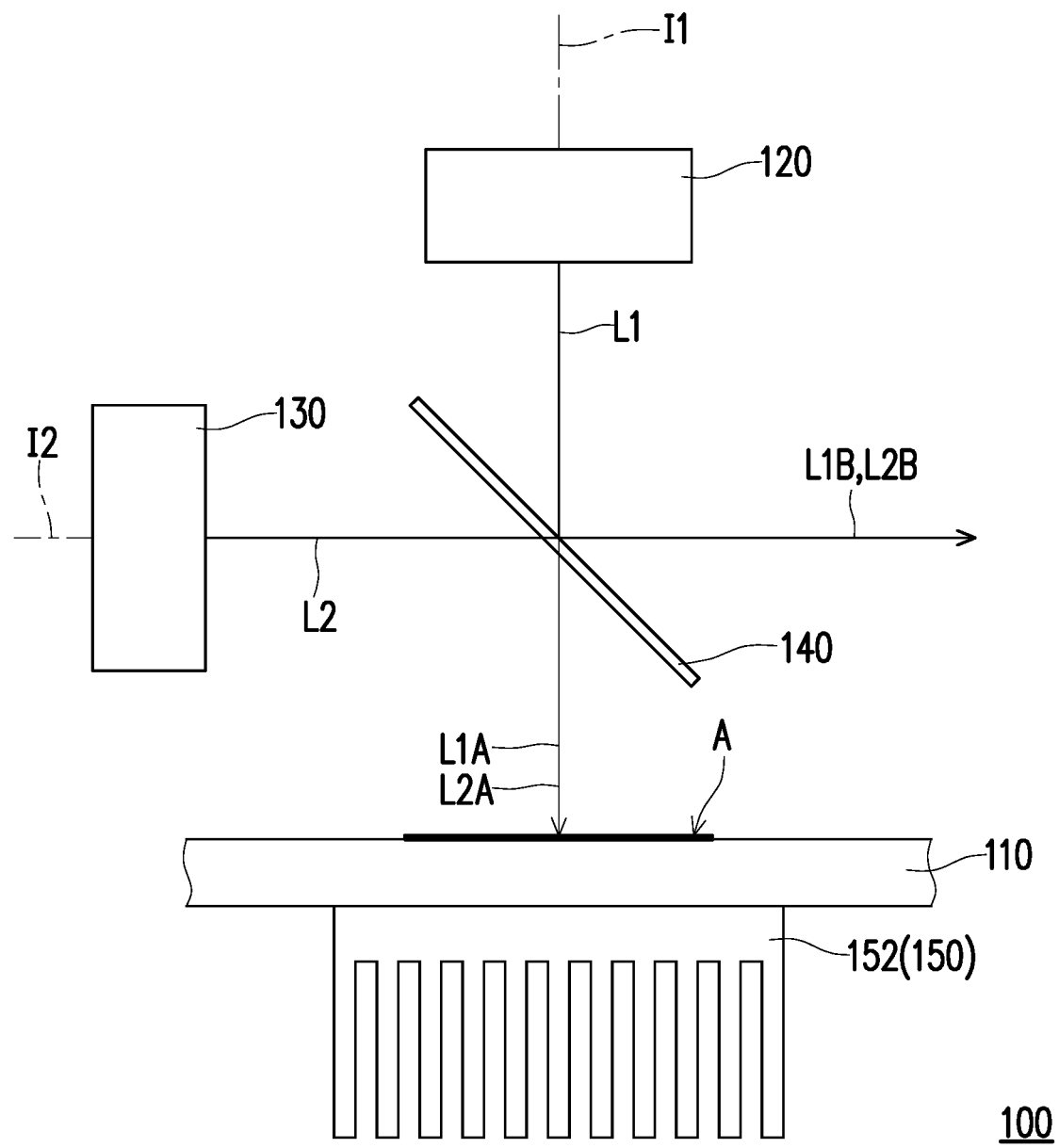
FIG. 2 is a schematic diagram of a portion of the illumination system according to an embodiment of the disclosure.

FIG. 2 is a schematic diagram of a portion of the illumination system according to an embodiment of the disclosure. With reference to FIG. 2, the illumination system 100 shown in FIG. 2 may at least be applied to the projection device 10 shown in FIG. 1, but the disclosure is not limited thereto. The illumination system 100 includes a housing 110, a first light source 120, a second light source 130, a polarization beam splitting element 140, and a heat dissipation module 150. The housing 110 has an accommodation space, which is configured to accommodate multiple light sources, multiple optical lenses, and/or multiple beam splitters, but the disclosure is not limited to a combination of actual optical elements of the illumination system 100.

The first light source 120 is disposed in the housing 110. The first light source 120 is configured to provide a first beam L1 to the polarization beam splitting element 140 along a first optical axis I1, and the polarization beam splitting element 140 is configured to reflect a portion of the first beam L1. The first optical axis I1 is a geometric center of the first light source 120. For example, in the embodiment, the first light source 120 is, for example, a laser diode (LD) array, and the first beam L1 is a laser beam with S polarization. The polarization beam splitting element 140 is, for example, a polarization beam splitter (PBS). The polarization beam splitting element 140 reflects most of the first beam L1 with S polarization. Similar to the first light source 120, the second light source 130 may also be a laser diode array and is configured to provide a second beam L2 along a second optical axis I2, and the provided second beam L2 is a laser beam with P polarization. The second optical axis I2 is a geometric center of the second light source 130. The second optical axis I2 is, for example, perpendicular to the first optical axis I1. The polarization beam splitting element 140 allows the second beam L2 with P polarization to penetrate. A wavelength of the first beam L1 and the second beam L2 may be the same or different, and the disclosure is not limited thereto. It is should be noted that a small portion of the first beam L1 with S polarization is not reflected by the polarization beam splitting element 140 and penetrates the polarization beam splitting element 140 to be transmitted to the housing 110, and a small portion of the second beam L2 with P polarization does not penetrates the polarization beam splitting element 140 and is reflected to housing 110. Here, a beam L1A represents the small portion of the first beam L1 while a beam L1B represents the first beam L1 that is reflected by the polarization beam splitting element 140, and a beam L2A represents the small portion of the second beam L2 while a beam L2B represents the second beam L2 that has penetrated the polarization beam splitting element 140.

Figure 3:
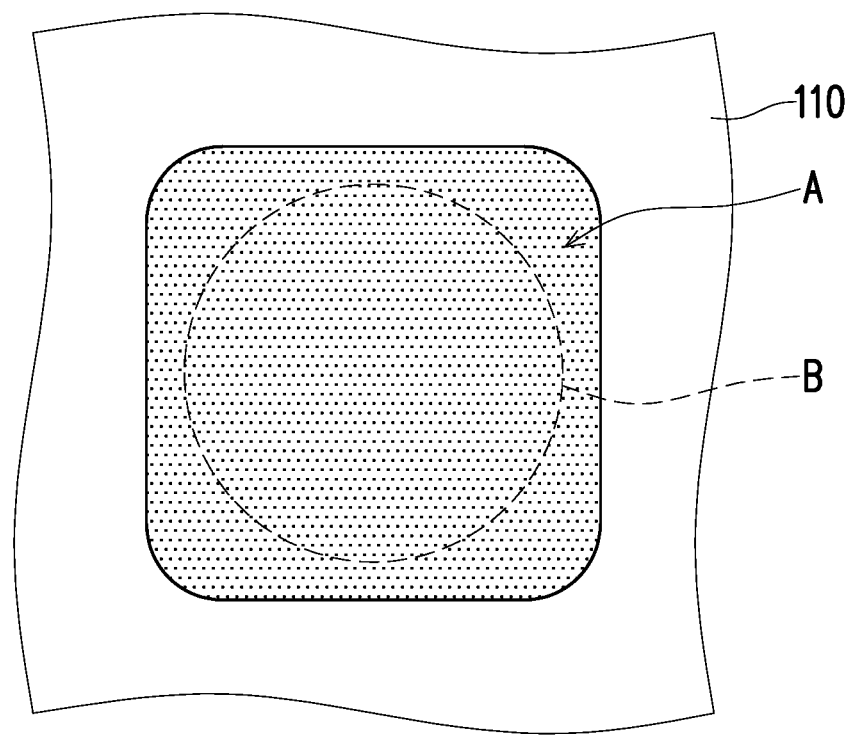
FIG. 3 is a schematic diagram of the housing in the illumination system in FIG. 2 from another perspective.

FIG. 3 is a schematic diagram of the housing in the illumination system in FIG. 2 from another perspective. With reference to FIGS. 2 and 3 concurrently, a portion of an inner surface of the housing 110 has a light absorption region A. Specifically, in the embodiment, a position of the light absorption region A of the housing 110 is located on the first optical axis I1, and the polarization beam splitting element 140 is located between the first light source 120 and the light absorption region A. The light absorption region A is configured to absorb the first beam L1 (the beam L1A) that is not reflected by the polarization beam splitting element 140 and the second beam L2 (the beam L2A) that does not penetrate the polarization beam splitting element 140, so as to transform them into heat. In the embodiment, the light absorption region A has a material that is coated, sprayed, or anodized, and an absorption rate of the light absorption region A for the first beam L1 and the second beam L2 is greater than 50%. In the embodiment, an irradiated area B of the first beam L1 and the second beam L2 on the housing 110 is less than or equal to an area of the light absorption region A. It should be noted that the irradiated area B of the first beam L1 and the second beam L2 on the housing 110 is specifically the irradiated area B of the beam L1A and the beam L2A on housing 110.

The heat dissipation module 150 is disposed on an outer surface of the housing 110 to correspond to the position of the light absorption region A, and the heat generated by the light absorption region A is dissipated by the heat dissipation module 150. In the embodiment, the heat dissipation module 150 includes a heat dissipation fin 152 attached to the outer surface of the housing 110 to correspond to the light absorption region A on the inner surface. Therefore, the beam L1A that is not reflected by the polarization beam splitting element 140 and is transmitted to the housing 110 and the beam L2A that does not penetrate the polarization beam splitting element 140 and is transmitted to the housing 110 may be absorbed by the light absorption region A and transformed into heat, and then the heat is dissipated by the heat dissipation module 150. In this way, an internal temperature of the illumination system 100 may be lowered, and service life of other internal elements may be prolonged. In the embodiment, an orthographic projection area of the heat dissipation module 150 on the housing 110 is greater than the area of the light absorption region A, as shown in FIG. 2. For example, the orthographic projection area of the heat dissipation module 150 on the housing 110 is greater than the area of the light absorption region A by 50%.

Figure 4:
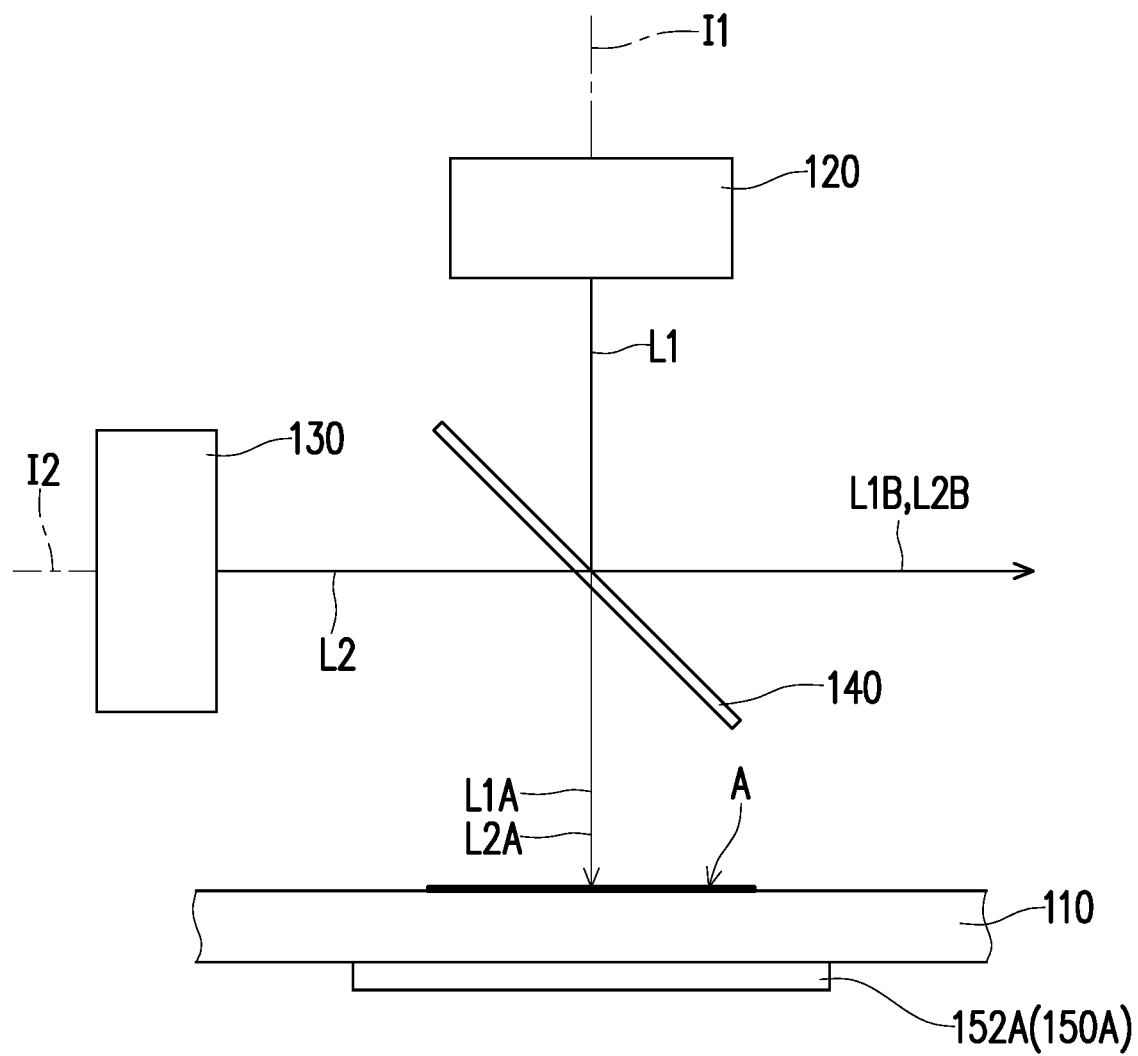
FIG. 4 is a schematic diagram of a portion of an illumination system according to another embodiment of the disclosure.

FIG. 4 is a schematic diagram of a portion of an illumination system according to another embodiment of the disclosure. With reference to FIG. 4, an illumination system 100A shown in FIG. 4 is similar to the illumination system 100 shown in FIG. 2. A difference between the two is that, in the embodiment, a heat dissipation module 150A of the illumination system 100A includes a cooling chip 152A, which is attached to the outer surface of the housing 110 to correspond to the light absorption region A on the inner surface. Therefore, the beam L1A that is not reflected by the polarization beam splitting element 140 and is transmitted to the housing 110 and the beam L2A that does not penetrate the polarization beam splitting element 140 and is transmitted to the housing 110 may be absorbed by the light absorption region A and transformed into heat, and then the heat is dissipated by the heat dissipation module 150A. In this way, an internal temperature of the illumination system 100A may be lowered and service life of other internal elements may be prolonged.

Figure 5:
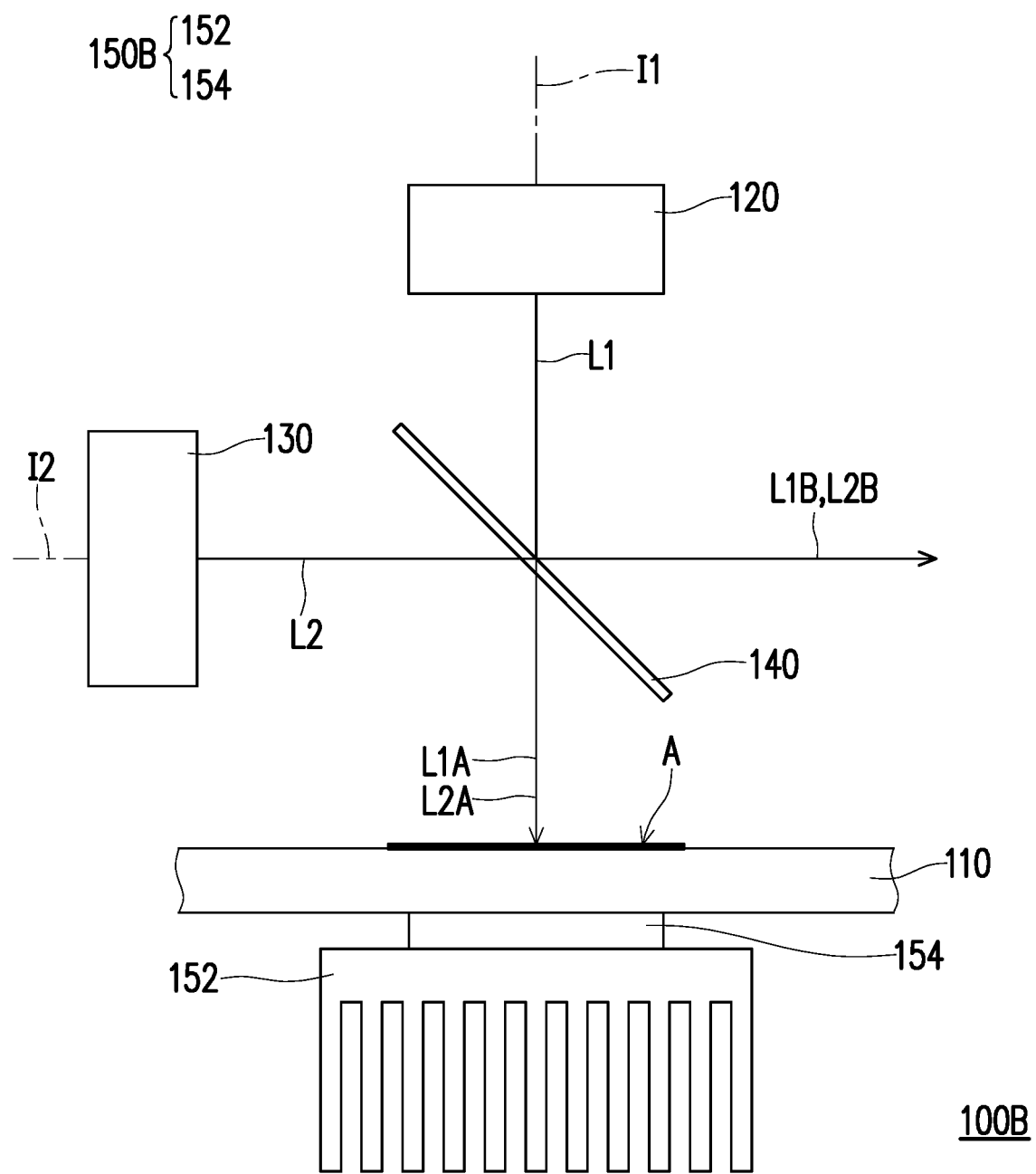
FIG. 5 is a schematic diagram of a portion of an illumination system according to another embodiment of the disclosure.

FIG. 5 is a schematic diagram of a portion of an illumination system according to another embodiment of the disclosure. With reference to FIG. 5, an illumination system 100B shown in FIG. 5 is similar to the illumination system 100 shown in FIG. 2. A difference between the two is that, in the embodiment, a heat dissipation module 150B of the illumination system 100B further includes a thermally conductive element 154, which is disposed between the housing 110 and the heat dissipation element 152, and is configured to correspond to the light absorption region A on the inner surface to conduct the heat generated by the light absorption region A. In the embodiment, the thermally conductive element 154 is, for example, a vapor chamber or a heat pipe. Therefore, the beam L1A that is not reflected by the polarization beam splitting element 140 and is transmitted to the housing 110 and the beam L2A that does not penetrate the polarization beam splitting element 140 and is transmitted to the housing 110 may be absorbed by the light absorption region A and transformed into heat, and then the heat is then transmitted to the thermally conductive element 154 to carry out external heat dissipation. In this way, an internal temperature of the illumination system 100B may be lowered, and service life of other internal elements may be prolonged. In another embodiment, the position of the light absorption region A in the housing 110 may further include an opening, and the heat dissipation module 150B is connected to the light absorption region A through the opening, but the disclosure is not limited thereto.

Figure 6:
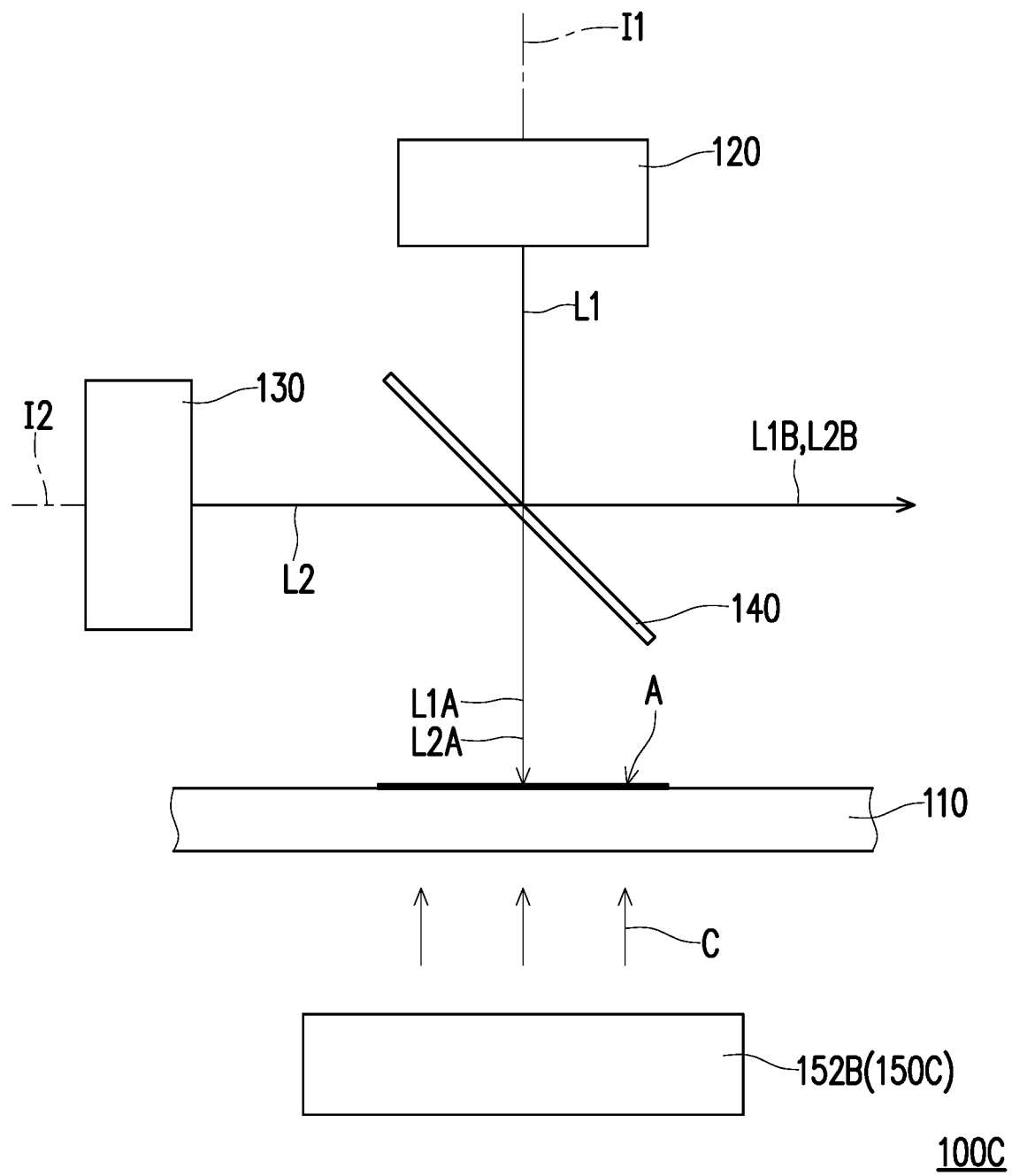
FIG. 6 is a schematic diagram of a portion of an illumination system according to another embodiment of the disclosure.

FIG. 6 is a schematic diagram of a portion of an illumination system according to another embodiment of the disclosure. With reference to FIG. 6, an illumination system 100C shown in FIG. 6 is similar to the illumination system 100 shown in FIG. 2. A difference between the two is that, in the embodiment, a heat dissipation element 152B of a heat dissipation module 150C of the illumination system 100C includes a fan, and the heat dissipation element 152B sends cold air C toward the light absorption region A. Therefore, the beam L1A that is not reflected by the polarization beam splitting element 140 and is transmitted to the housing 110 and the beam L2A that does not penetrate the polarization beam splitting element 140 and is transmitted to the housing 110 may be absorbed by the light absorption region A and transformed into heat, and then the heat is dissipated the dissipation element 152B blowing the cold air C toward the light absorption region A. In the embodiment, an air outlet area of the heat dissipation element 152B blowing the cold air C is greater than the irradiated area B. For example, the air outlet area of the heat dissipation element 152B blowing the cold air C is greater than the irradiated area B by 50%. In this way, an internal temperature of the illumination system 100C may be lowered and service life of other internal elements may be prolonged.

In summary, in the illumination system and projection device of the disclosure, the illumination system includes the housing, the first light source, the second light source, the polarization beam splitting element, and the heat dissipation module. The first light source provides the first beam to the polarization beam splitting element along the first optical axis, and the polarization beam splitting element reflects a portion of the first beam, and the second light source provides the second beam to the polarization beam splitting element along the second optical axis, and a portion of the second beam penetrates the polarization beam splitting element. A portion of the inner surface of the housing has the light absorption region, and the light absorption region is located on the first optical axis. Therefore, the first beam that is not reflected by the polarization beam splitting element and is transmitted to the housing and the second beam that does not penetrate the polarization beam splitting element and is transmitted to the housing may be absorbed by the light absorption region on the housing and transformed into heat, and then the heat is dissipated by the heat dissipation module that is disposed at the housing and which position corresponds to the light absorption region. In this way, the internal temperature of the illumination system may be lowered and the service life of the other internal elements may be prolonged.

The foregoing description of the preferred embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby enabling persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated. Therefore, the terms "the invention", "the present disclosure" or the like does not necessarily limit the claim scope to a specific embodiment, and the reference to particularly preferred exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims.

Any advantages and benefits described may not apply to all embodiments of the disclosure. It should be appreciated that variations may be made in the embodiments described by persons skilled in the art without departing from the scope of the disclosure as defined by the following claims. Moreover, no element and component in the disclosure is intended to be dedicated to the public regardless of whether the element or component is explicitly recited in the following claims.

What is claimed is:

1. An illumination system, comprising a housing, a first light source, a second light source, a polarization beam splitting element, and a heat dissipation module, wherein
   the first light source and the second light source are disposed in the housing, the first light source is configured to provide a first beam to the polarization beam splitting element along a first optical axis, and the second light source is configured to provide a second beam to the polarization beam splitting element along a second optical axis,
   the polarization beam splitting element is configured to reflect a portion of the first beam and enable a portion of the second beam to penetrate,
   a portion of an inner surface of the housing has a light absorption region, the light absorption region is located on the first optical axis, and the polarization beam splitting element is located between the first light source and the light absorption region, the light absorption region is configured to absorb the first beam that is not reflected by the polarization beam splitting element and the second beam that does not penetrate the polarization beam splitting element, so as to transform into heat, and
   the heat dissipation module is disposed on an outer surface of the housing to correspond to a position of the light absorption region, and the heat generated by the light absorption region is dissipated by the heat dissipation module.

2. The illumination system according to claim 1, wherein an irradiated area of the first beam and the second beam on the housing is less than or equal to an area of the light absorption region.

3. The illumination system according to claim 1, wherein an orthographic projection area of the heat dissipation module on the housing is greater than an area of the light absorption region.

4. The illumination system according to claim 1, wherein the light absorption region has a material that is coated, sprayed, or anodized.

5. The illumination system according to claim 1, wherein the heat dissipation module comprises a heat dissipation element, and the heat dissipation element comprises a heat dissipation fin or a cooling chip.

6. The illumination system according to claim 5, wherein the heat dissipation module further comprises a thermally conductive element, and the thermally conductive element is disposed between the housing and the heat dissipation element.

7. The illumination system according to claim 6, wherein the thermally conductive element is a vapor chamber or a heat pipe.

8. The illumination system according to claim 1, wherein the heat dissipation module comprises a heat dissipation element, the heat dissipation element comprises a fan, and the heat dissipation element blows cold air toward the light absorption region.

9. The illumination system according to claim 1, wherein the housing comprises an opening, and the heat dissipation module is connected to the light absorption region through the opening.

10. The illumination system according to claim 1, wherein the light absorption region has an absorption rate for the first beam that is greater than 50%.

11. A projection device, comprising an illumination system, at least one light valve, and a projection lens, wherein
the illumination system is configured to provide an illumination beam, and the illumination system comprises a housing, a first light source, a second light source, a polarization beam splitting element, and a heat dissipation module, wherein
the first light source and the second light source are disposed in the housing, the first light source is configured to provide a first beam to the polarization beam splitting element along a first optical axis, and the second light source is configured to provide a second beam to the polarization beam splitting element along a second optical axis,
the polarization beam splitting element is configured to reflect a portion of the first beam and enable a portion of the second beam to penetrate,
a portion of an inner surface of the housing has a light absorption region, the light absorption region is located on the first optical axis, and the polarization beam splitting element is located between the first light source and the light absorption region, the light absorption region is configured to absorb the first beam that is not reflected by the polarization beam splitting element and the second beam that does not penetrate the polarization beam splitting element, so as to transform into heat, and
the heat dissipation module is disposed on an outer surface of the housing to correspond to a position of the light absorption region, and the heat generated by the light absorption region is dissipated by the heat dissipation module,
the at least one light valve is disposed on a transmission path of the illumination beam and is configured to convert the illumination beam into an image beam, and
the projection lens is disposed on a transmission path of the image beam and is configured to project the image beam out of the projection device.

12. The projection device according to claim 11, wherein an irradiated area of the first beam and the second beam on the housing is less than or equal to an area of the light absorption region.

13. The projection device according to claim 11, wherein an orthographic projection area of the heat dissipation module on the housing is greater than an area of the light absorption region.

14. The projection device according to claim 11, wherein the light absorption region is made of a material that is coated, sprayed, or anodized.

15. The projection device according to claim 11, wherein the heat dissipation module comprises a heat dissipation element, and the heat dissipation element comprises a heat dissipation fin or a cooling chip.

16. The projection device according to claim 15, wherein the heat dissipation module further comprises a thermally conductive element, and the thermally conductive element is disposed between the housing and the heat dissipation element.

17. The projection device according to claim 16, wherein the thermally conductive element is a vapor chamber or a heat pipe.

18. The projection device according to claim 11, wherein the heat dissipation module comprises a heat dissipation element, the heat dissipation element comprises a fan, and the heat dissipation element blows cold air toward the light absorption region.

19. The projection device according to claim 11, wherein the housing comprises an opening, and the heat dissipation module is connected to the light absorption region through the opening.

20. The projection device according to claim 11, wherein the light absorption region has an absorption rate for the first beam that is greater than 50%.

* * * * *